United States Patent
Trotskovsky et al.

(10) Patent No.: US 10,033,338 B2
(45) Date of Patent: Jul. 24, 2018

(54) SWITCHED INDUCTOR/TRANSFORMER FOR DUAL-BAND LOW-NOISE AMPLIFIER (LNA)

(71) Applicant: QUALCOMM Incorporated, San Diego, CA (US)

(72) Inventors: Konstantin Trotskovsky, Berkeley, CA (US); Vipul Chawla, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/185,825

(22) Filed: Jun. 17, 2016

(65) Prior Publication Data
US 2017/0366146 A1    Dec. 21, 2017

(51) Int. Cl.
H03F 3/217     (2006.01)
H03F 3/195     (2006.01)
(Continued)

(52) U.S. Cl.
CPC ........... *H03F 3/2171* (2013.01); *H03F 3/195* (2013.01); *H03F 3/45475* (2013.01); *H04B 1/04* (2013.01);
(Continued)

(58) Field of Classification Search
CPC .... H03F 3/2171; H03F 3/195; H03F 3/45475; H03F 3/217; H03F 3/2173;
(Continued)

(56) References Cited

U.S. PATENT DOCUMENTS 7,890,069 B2     2/2011  Kyranas et al.
8,188,788 B2 *   5/2012  Lee .................. H03F 3/211
                                                 330/195
(Continued)

OTHER PUBLICATIONS

Amiri M., et al., "A Pseudo-Concurrent Multiband LNA using Double Tuned Transformers," 23rd Iranian Conference on Electrical Engineering (ICEE), 2015, pp. 1312-1315.
Yu X., et al., "Analysis and Design of a Reconfigurable Multimode Low-Noise Amplifier Utilizing a Multitap Transformer," IEEE Transactions on Microwave Theory and Techniques, Mar. 2013, vol. 61 (3), pp. 1236-1246.

*Primary Examiner* — Khanh V Nguyen
(74) *Attorney, Agent, or Firm* — Patterson & Sheridan, L.L.P.

(57) ABSTRACT

Certain aspects of the present disclosure generally relate to an amplifier configured to process signals received in different frequency bands, where at least a portion of the amplifier is shared between different modes corresponding to the different frequency bands. One example circuit generally includes an amplifier having at least one first transistor configured to amplify a first signal received in a first mode of operation (e.g., associated with a particular frequency band), and at least one second transistor configured to amplify a second signal received in a second mode of operation. The amplifier may also include a transformer comprising a primary winding and a secondary winding, and one or more switches configured to selectively couple the primary winding to the first transistor or the second transistor based on the first mode or the second mode of operation, respectively. In certain aspects, the transformer may be coupled to a transconductance circuit.

26 Claims, 7 Drawing Sheets

(51) Int. Cl.
  *H03F 3/45* (2006.01)
  *H04W 84/04* (2009.01)
  *H04B 1/04* (2006.01)
  *H03F 3/00* (2006.01)
(52) U.S. Cl.
  CPC ............. *H04W 84/04* (2013.01); *H03F 3/005* (2013.01); *H03F 3/217* (2013.01); *H03F 3/2173* (2013.01); *H03F 2200/294* (2013.01); *H03F 2200/333* (2013.01); *H03F 2200/451* (2013.01); *H03F 2200/541* (2013.01); *H03F 2203/45228* (2013.01); *H03F 2203/45288* (2013.01)
(58) Field of Classification Search
  CPC .... H03F 2200/432; H03F 1/0288; H03F 1/07; H03F 3/211; H03F 3/602; H03F 1/22; H03F 1/223; H03F 2200/294; H04B 1/04; H04W 84/04
  USPC ............. 330/124 R, 277, 251, 286, 295, 311
  See application file for complete search history.

(56) References Cited

U.S. PATENT DOCUMENTS

| | | | |
|---|---|---|---|
| 8,294,520 B2 | 10/2012 | Borremans | |
| 8,975,968 B2* | 3/2015 | Abdelhalem | H03F 1/22 |
| | | | 330/311 |
| 9,166,852 B2* | 10/2015 | Davierwalla | H03G 3/20 |
| 9,692,368 B2 | 6/2017 | Lin et al. | |
| 2010/0271128 A1* | 10/2010 | Afsahi | H03F 1/0277 |
| | | | 330/253 |
| 2014/0210560 A1* | 7/2014 | Ran | H03F 3/45179 |
| | | | 330/311 |
| 2014/0266461 A1* | 9/2014 | Youssef | H03F 3/68 |
| | | | 330/295 |
| 2015/0280651 A1 | 10/2015 | Uzunkol et al. | |
| 2015/0303876 A1* | 10/2015 | Chan | H03F 1/0205 |
| | | | 330/253 |
| 2016/0036392 A1 | 2/2016 | Bohsali et al. | |

\* cited by examiner

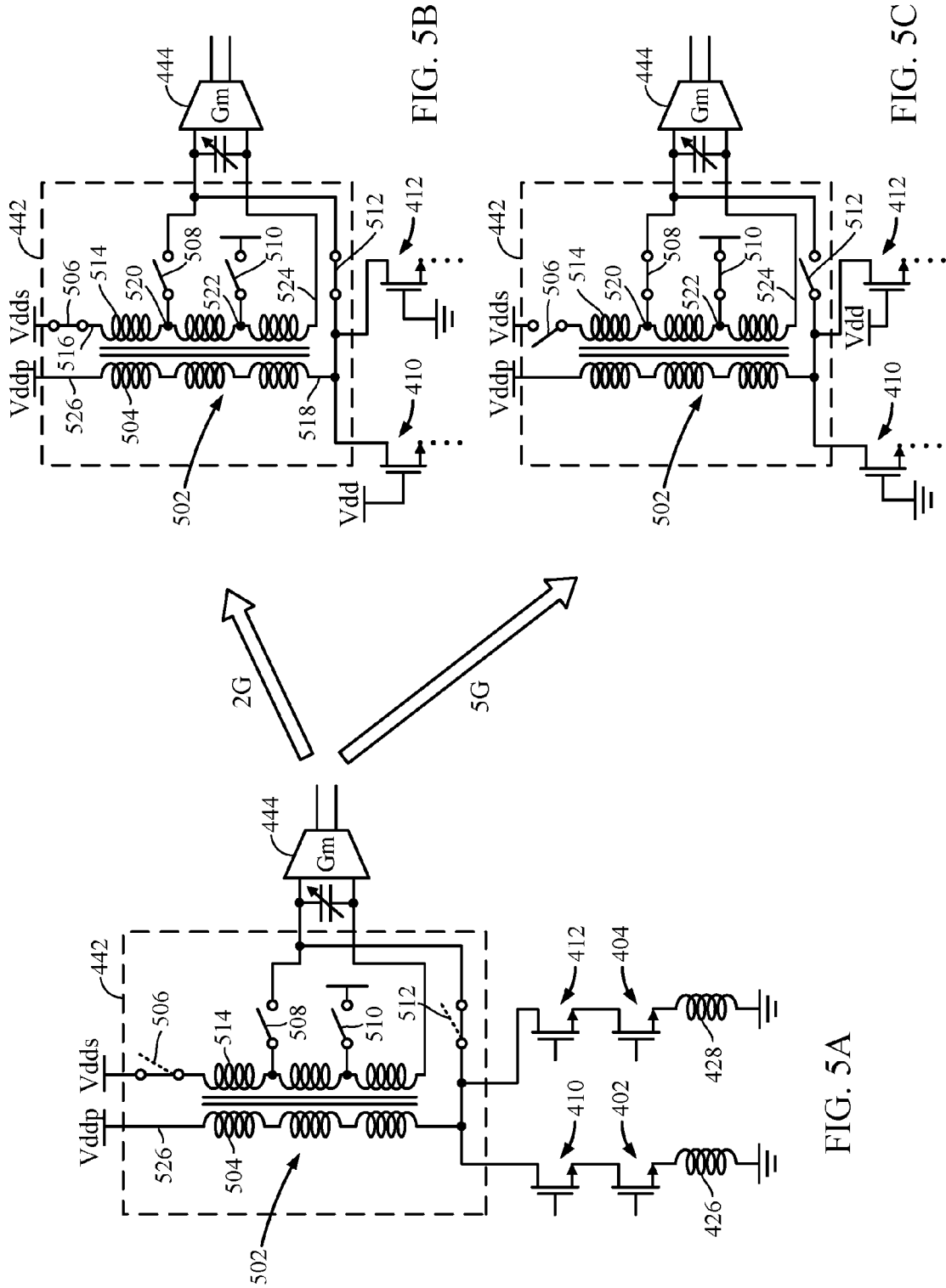

SWITCHED INDUCTOR/TRANSFORMER FOR DUAL-BAND LOW-NOISE AMPLIFIER (LNA)

TECHNICAL FIELD

Certain aspects of the present disclosure generally relate to electronic circuits and, more particularly, to a circuit for signal amplification.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3$^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

MSs and BSs may include circuitry for amplifying and frequency converting received signals in different frequency bands. For example, a low-noise amplifier (LNA) may be used to amplify a lower-power signal that may be received by an antenna. The amplified signal generated by the LNA may be sent to a mixer. The mixer may be used to effectively multiply two input signals together, thereby producing an output signal having frequency components at the sum of and the difference of the two input signals' frequencies. Thus, the mixer may be used to adjust a frequency of the amplified signal generated by the LNA.

SUMMARY

Certain aspects of the present disclosure generally relate to an amplifier configured to process signals received in different frequency bands. In certain aspects, at least a portion of the amplifier may be shared between different modes of operation corresponding to the different frequency bands.

Certain aspects of the present disclosure provide an apparatus. The apparatus generally includes an amplifier comprising at least one first transistor configured to amplify a first signal, at least one second transistor configured to amplify a second signal, a transformer comprising a primary winding and a secondary winding, and one or more switches configured to selectively couple the primary winding to the first transistor or the second transistor.

Certain aspects of the present disclosure provide a method for signal amplification. The method generally includes coupling at least one first transistor to a primary winding of a transformer, amplifying a first signal with the at least one first transistor, decoupling the at least one first transistor from the primary winding, coupling at least one second transistor to the primary winding of the transformer, and amplifying a second signal with the at least one second transistor.

Certain aspects of the present disclosure provide an apparatus for signal amplification. The apparatus generally includes means for amplifying a first signal, means for amplifying a second signal, and means for selectively coupling the means for amplifying the first signal or the means for amplifying the second signal to a primary winding of a transformer.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIGS. 5A, 5B, and 5C illustrate an example combining circuit for an RX path, in accordance with certain aspects of the present disclosure.

DETAILED DESCRIPTION

Figure 1:
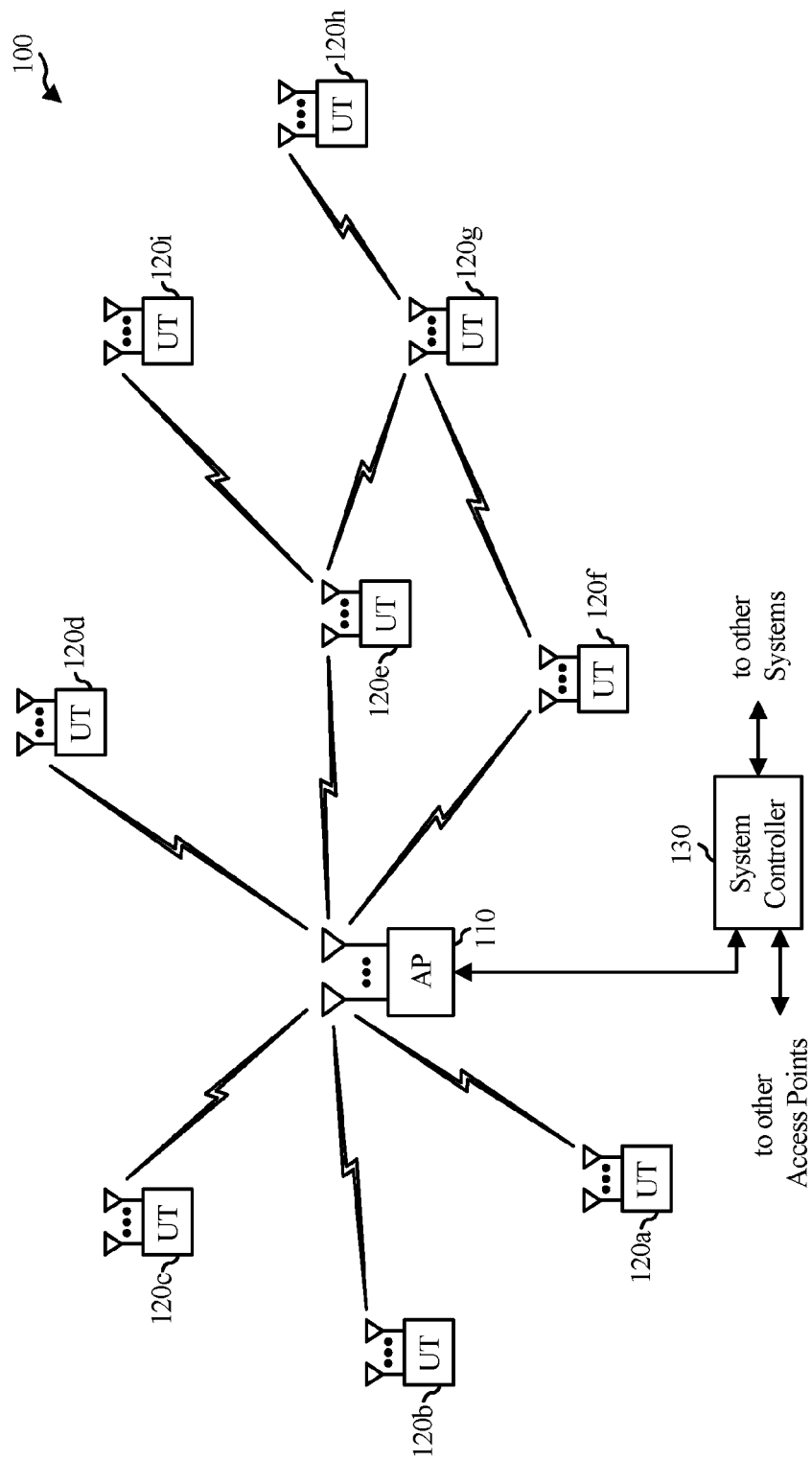
FIG. 1 is a diagram of an example wireless communications network, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

In certain aspects of the present disclosure, the access point 110 and/or user terminal 120 may include a low-noise amplifier (LNA) and a mixer configured to process signals received in different frequency bands. In certain aspects, at least a portion of the LNA and the mixer may be shared between different modes of operation corresponding to the different frequency bands.

Figure 2:
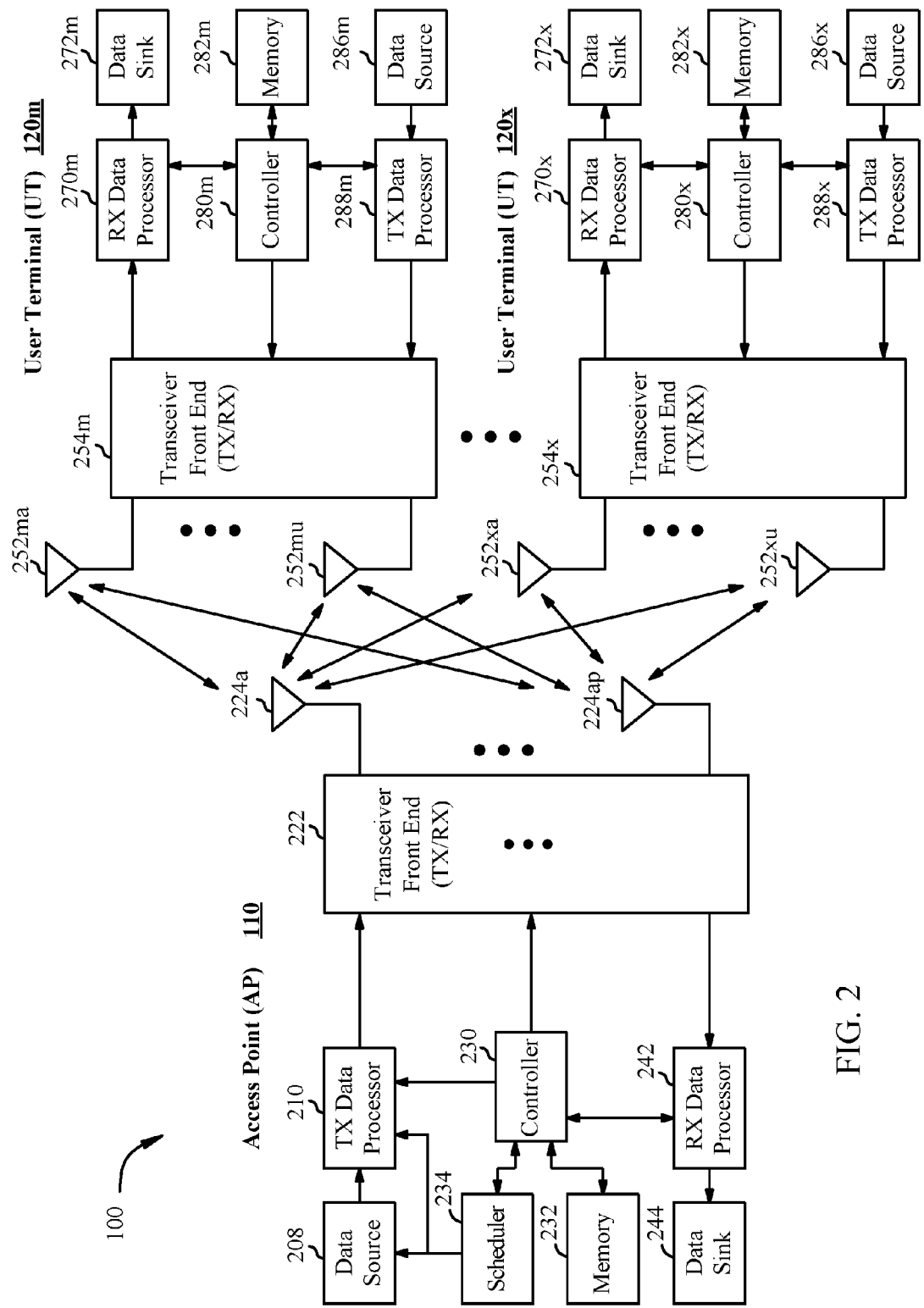
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include a low-noise amplifier (LNA) and a mixer. The LNA and the mixer may be configured to process signals received in different frequency bands. In certain aspects, at least a portion of the LNA and the mixer may be shared between different modes of operation corresponding to the different frequency bands.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
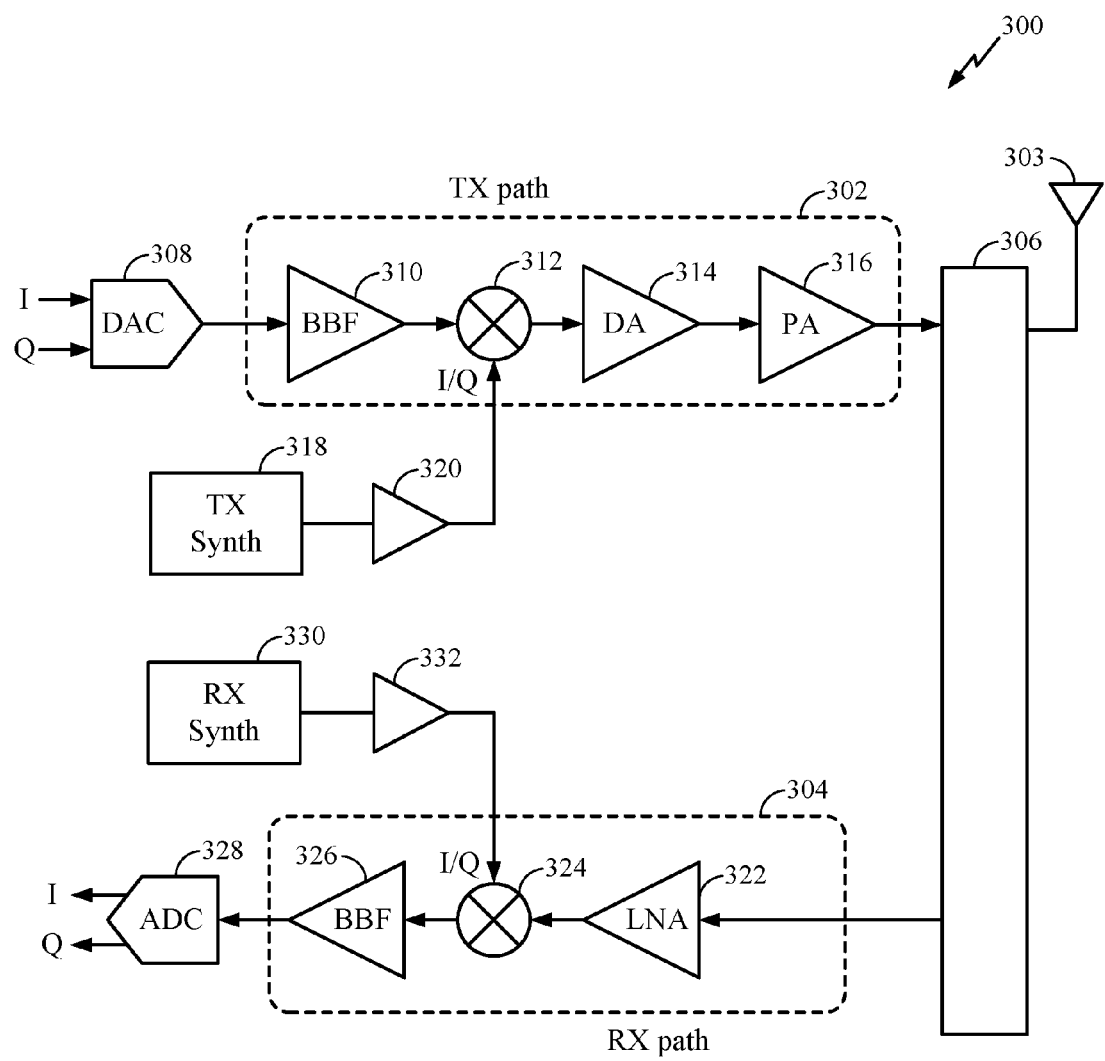
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. In some aspects of the present disclosure, the LNA 322 and the mixer 324 may be configured to process signals received in different frequency bands where at least a portion of the LNA 322 and the mixer 324 are shared between different modes corresponding to the different frequency bands. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Low-Noise Amplifier (LNA)

The latest standards for wireless local area network (WLAN) describe operations in both 2G (2.4 GHz) and 5G (5 GHz) bands. Thus, receivers designed in accordance with the latest standards may be designed to operate in multiple bands. For example, signals received by the LNA 322 of FIG. 3 may be received in any one of the multiple bands, and thus, the LNA 322 may be designed to efficiently amplify signals received in the different bands depending on the mode of operation. Moreover, integrated circuit (IC) designers are having to find ways to fit more and more components in a limited amount of area. Thus, available chip area is becoming scarcer and scarcer, and thus, it is desirable to reduce the chip area consumed by RFFE circuitry. Aspects of the present disclosure are directed towards efficiently amplifying signals received in the various supported bands, while reducing the die area consumed by the RFFE circuitry.

Figure 4A:
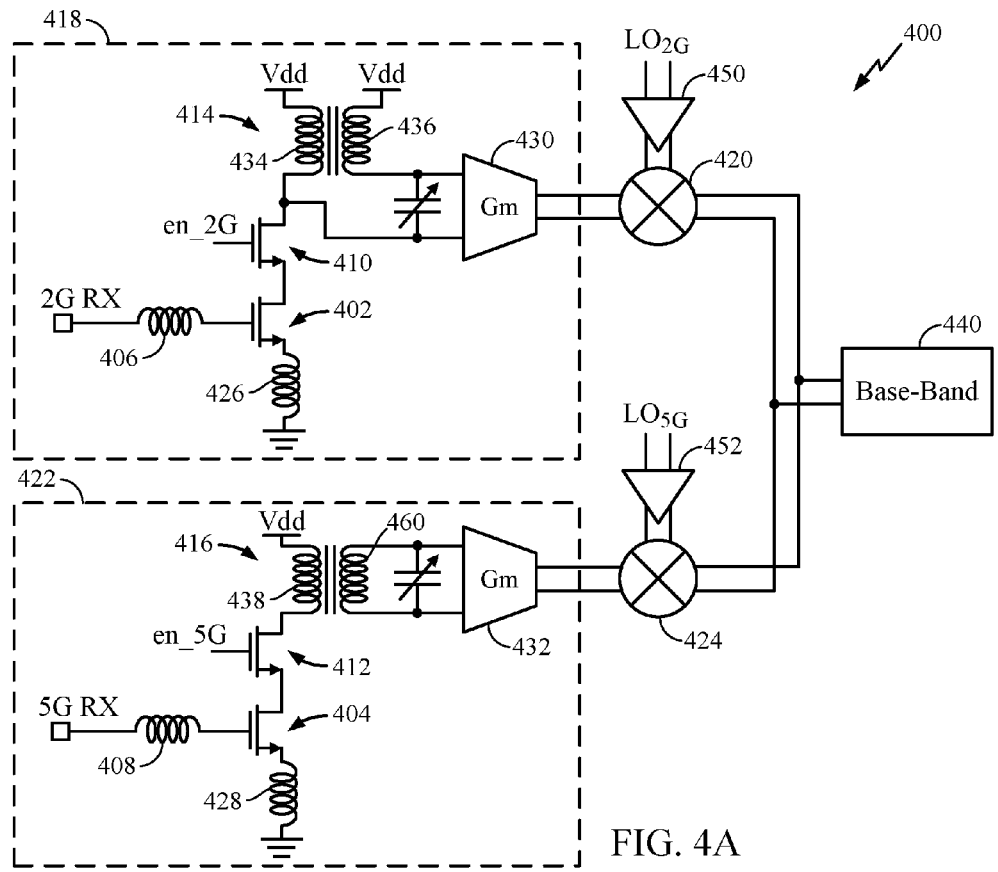
FIGS. 4A and 4B illustrate an example receive (RX) path, in accordance with certain aspects of the present disclosure.

FIG. 4A illustrates an example receive (RX) path 400 having an LNA 418 and a mixer 420 designated for processing of signals received in a 2G band, for example, and an LNA 422 and a mixer 424 designated for processing signals received in a 5G band, for example. As illustrated, the LNA 418 may include a transistor 402 configured to amplify a signal received in the 2G band, and the LNA 422 may include a transistor 404 configured to amplify a signal received in the 5G band. For example, the signals received in the 2G and 5G bands may be coupled to the gate terminals of transistors 402 and 404. In some aspects, an inductor 406 and an inductor 408 may be coupled to the gate terminals of transistors 402 and 404, respectively, to filter the signals received in the 2G and 5G bands. Inductors 426 and 428 may be coupled to the source terminals of transistors 402 and 404 and may be used for source degeneration, for example.

The transistors 402 and 404 may be coupled to respective switches 410 and 412 (implemented via transistors, for example) to selectively couple the transistors 402 and 404 to transformers 414 and 416. That is, switches 410 and 412 may be operated to deactivate one of the LNAs 418 and 422 based on a mode of operation (e.g., 2G or 5G) by electrically decoupling the transistor 402 or 404 from its respective mixer 420 or 424. For example, during a 2G band of operation, switch 410 may be closed (e.g., the transistor may be in an on state), and switch 412 may be opened (e.g., the transistor may be in an off state). During a 5G band of operation, however, switch 410 may be opened, and switch 412 may be closed. In some cases, each of the transistors 402 and 404 may be coupled to one or more other transistors (not shown) to facilitate amplification of signals received in the 2G and 5G bands. Each of the LNAs 418 and 422 may be coupled to a load that may be implemented using transformers 414 and 416. The transformers 414 and 416 may be coupled to transconductance (Gm) circuits, such as Gm amplifiers 430 and 432, respectively.

In certain aspects, the transformer 414 may be configured as an inductive load for the transistor 402, whereas the transformer 416 may be configured as a transformer load, as illustrated in FIG. 4A. That is, the load from the transconductance amplifier 430 or 432 may be about 370 femtofarads (fF) differential, which may be too large to allow for the use of an inductive load at higher frequencies (e.g., in the 5G band). Thus, in order to reduce the effective load capacitance of the transconductance amplifier for signal reception in the 5G band, the transformer 416 may be configured as a transformer load. However, the transformer 414 may be configured as an inductive load for signal reception in the 2G band.

As illustrated, the primary winding 434 of the transformer 414 may be coupled to a first input terminal (e.g., positive input) of the transconductance amplifier 430, and the secondary winding 436 of the transformer 414 may be coupled to a second input terminal (e.g., negative input) of the transconductance amplifier 430. Thus, the primary winding 434 of the transformer 414 may be configured as an inductive load for the transistor 402. The transformer 416 may be configured as a transformer load by coupling the primary winding 438 of the transformer 416 to the transistor 404, and coupling the secondary winding 460 of the transformer 416 across the first input terminal (e.g., positive input) and the second input terminal (e.g., negative input) of the transconductance amplifier 432.

The outputs of the transconductance amplifiers 430 and 432 may be coupled to respective mixers 420 and 424. Mixers 420 and 424 may mix the amplified signals received in the 2G and 5G bands with local oscillator signals. For example, the output signal of the transconductance amplifier 430 may be mixed with an LO signal for a 2G band and the output signal of the transconductance amplifier 432 may be mixed with an LO signal for a 5G band, as illustrated. The LO signal for the 2G band may be buffered via a buffer 450, and the LO signal for the 5G band may be buffered via a buffer 452. The mixers 420 and 424 may be coupled to a common baseband circuit 440, which may include a BBF (e.g., BBF 326), or an intermediate frequency (IF) circuit (not shown).

As illustrated in FIG. 4A, the example receive (RX) path 400 includes separate transformers 414 and 416, separate transconductance amplifiers 430 and 432, separate buffers 450 and 452, and separate mixers 420 and 424 for processing received signals in different bands (2G and 5G bands). Aspects of the present disclosure are directed to an RX path having a reduced number of components for processing of signals received in different bands depending on a mode of operation, reducing the die area consumed by the RX path.

Figure 4B:
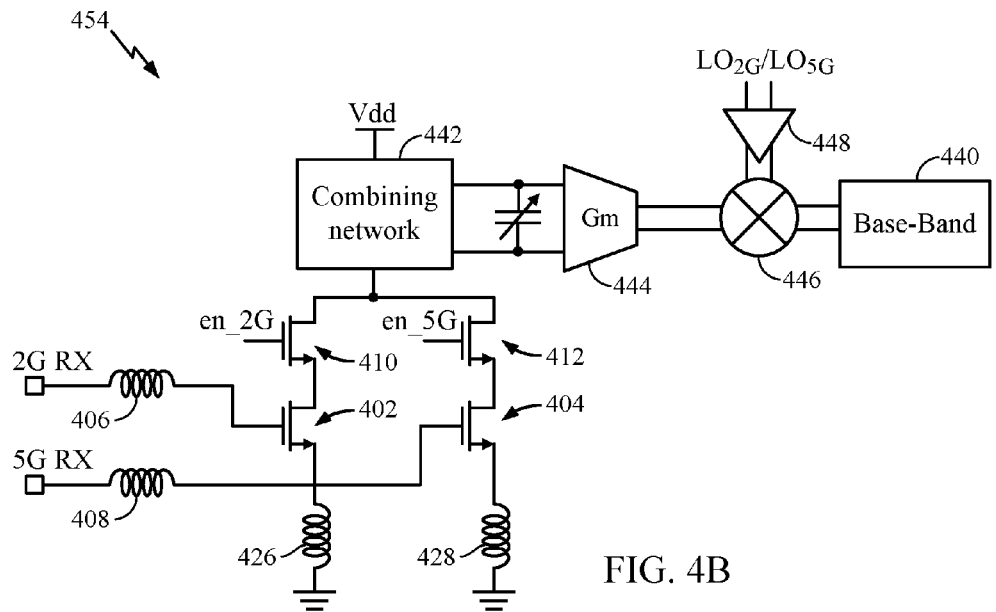

FIG. 4B illustrates an example RX path 454 having a combining circuit 442 that can serve as a load for amplification of signals received in different bands depending on a mode of operation, in accordance with certain aspects of the present disclosure. For example, transistors 402 and 404 may be selectively coupled to the combining circuit 442, and the combining circuit 442 may be coupled to a transconductance amplifier 444. Although a transconductance amplifier 444 is illustrated in FIG. 4B, the combining circuit 442 may be coupled to any suitable signal processing circuit, such as a different type of amplifier, a buffer, a filter, and the like.

The output of the transconductance amplifier 444 may be coupled to a mixer 446, which may be configured to mix the output signal of the transconductance amplifier 444 with either an LO signal for the 2G band or an LO signal for the 5G band, depending on the mode of operation. The LO signals for the 2G band and the 5G band may be buffered by a common buffer 448. While 2G and 5G bands are used herein as examples, additional and/or alternative frequency bands may be supported by the RX path 454 with the combining circuit 442.

FIG. 5A illustrates the example combining circuit 442, in accordance with certain aspects of the present disclosure. As illustrated, the combining circuit 442 may include a transformer 502 having a primary winding 504 that is magnetically coupled to the secondary winding 514. The primary winding 504 may be selectively coupled to transistors 402 and 404 via switches 410 and 412 (e.g., transistors), respectively. The combining circuit 442 may also include a plurality of switches 506, 508, 510, and 512, which may be operated to configure the transformer 502 as an inductive load or a transformer load, based on a mode of operation (e.g., 2G band or 5G band). The switches 506, 508, 510, and/or 512 may be implemented with transistors, for example.

FIG. 5B illustrates an example configuration of the combining circuit 442 when receiving signals in a 2G band, in accordance with certain aspects of the present disclosure. As illustrated, the switch 410 may be closed by driving the gate terminal of switch 410 (transistor) to a positive voltage rail, and switch 412 may be opened by driving the gate terminal of switch 412 (transistor) to a reference potential (e.g., electrical ground). Moreover, switch 506 may be closed, coupling the terminal 516 of the secondary winding 514 to a voltage rail ($Vdd_S$), and switch 512 may be closed coupling the terminal 518 of the primary winding 504 to an input terminal (e.g., positive input terminal) of the transconductance amplifier 444. Switches 508 and 510, coupled to taps 520 and 522, respectively, may be open, and the terminal 526 of the primary winding 504 may be coupled to a voltage rail ($Vdd_P$), which may have the same voltage level as $Vdd_S$ in some aspects. Therefore, the transformer 502 may be configured as an inductive load for the transistor 402. The turns ratio of the transformer 502 in the configuration of FIG. 5B may be 1:1.

FIG. 5C illustrates an example configuration of the combining circuit 442 when receiving signals in a 5G band, in accordance with certain aspects of the present disclosure. As illustrated, the switch 412 may be closed by driving the gate terminal of switch 412 (transistor) to a positive voltage rail, and switch 410 may be opened by driving the gate terminal of switch 410 (transistor) to a reference potential. Moreover, switch 508 may be closed, coupling the tap 520 of the secondary winding 514 to an input terminal (positive input terminal) of the transconductance amplifier 444, and switch 510 may be closed, coupling the tap 522 of the secondary winding 514 to a voltage rail representing a common-mode voltage of the transconductance amplifier 444. Thus, the transformer 502 may be configured as a transformer load. The effective turns ratio of the transformer 502 in the configuration of FIG. 5C may be 3:2.

Figure 6A:
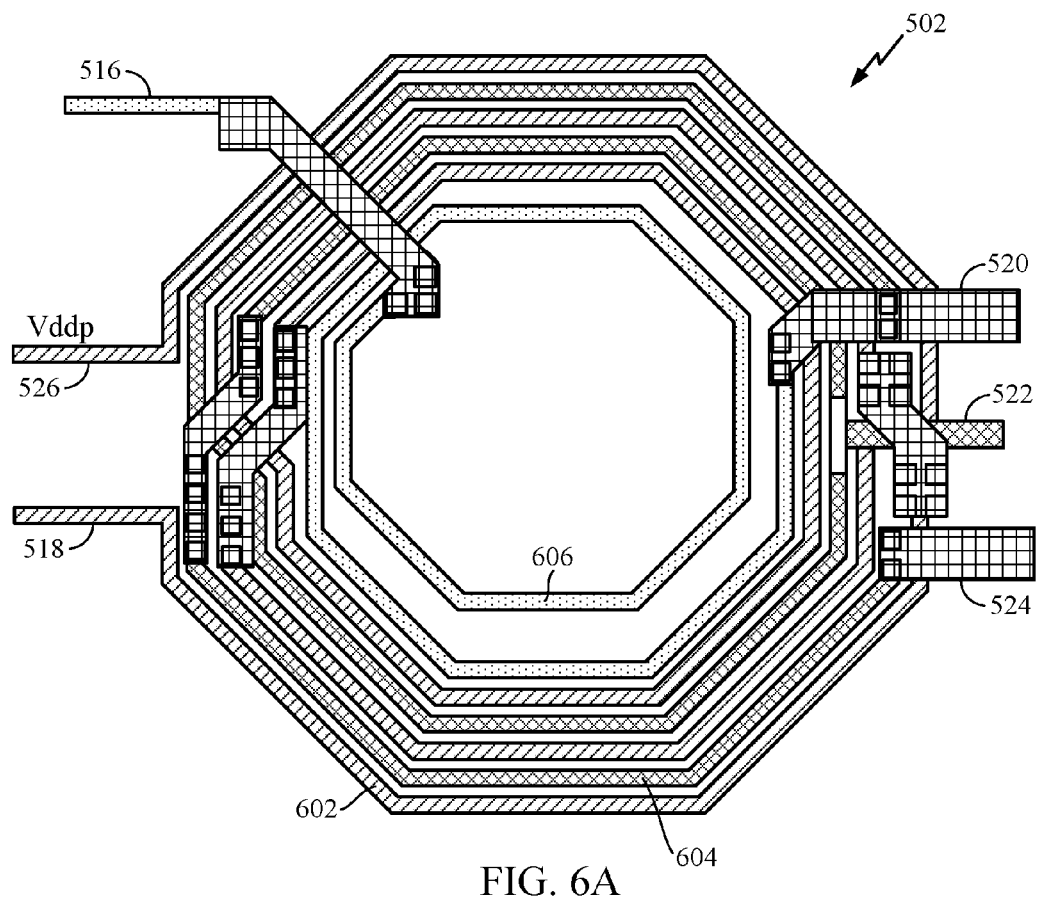
FIGS. 6A and 6B illustrate an example layout of a transformer of the combining circuit of FIG. 5A, in accordance with certain aspects of the present disclosure.
Figure 6B:
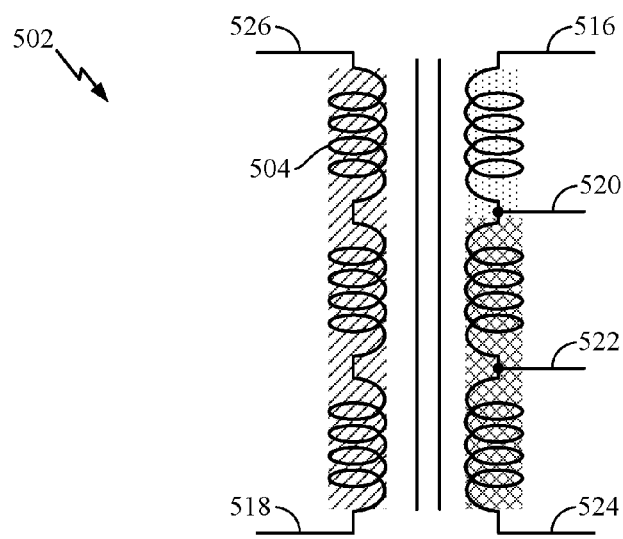

FIG. 6A illustrates an example layout of the transformer 502, in accordance with certain aspects of the present disclosure. The example layout of FIG. 6A includes traces for the primary winding 504 wound around traces for the secondary winding 514, such that the primary and secondary windings 504 and 514 are magnetically coupled. The shading of the traces corresponds to the portions of the primary and secondary windings 504 and 514 as illustrated in FIG. 6B. For example, the trace 602 may correspond to the primary winding 504, while the traces 604 and 606 may correspond to the secondary winding 514, as illustrated.

Figure 7:
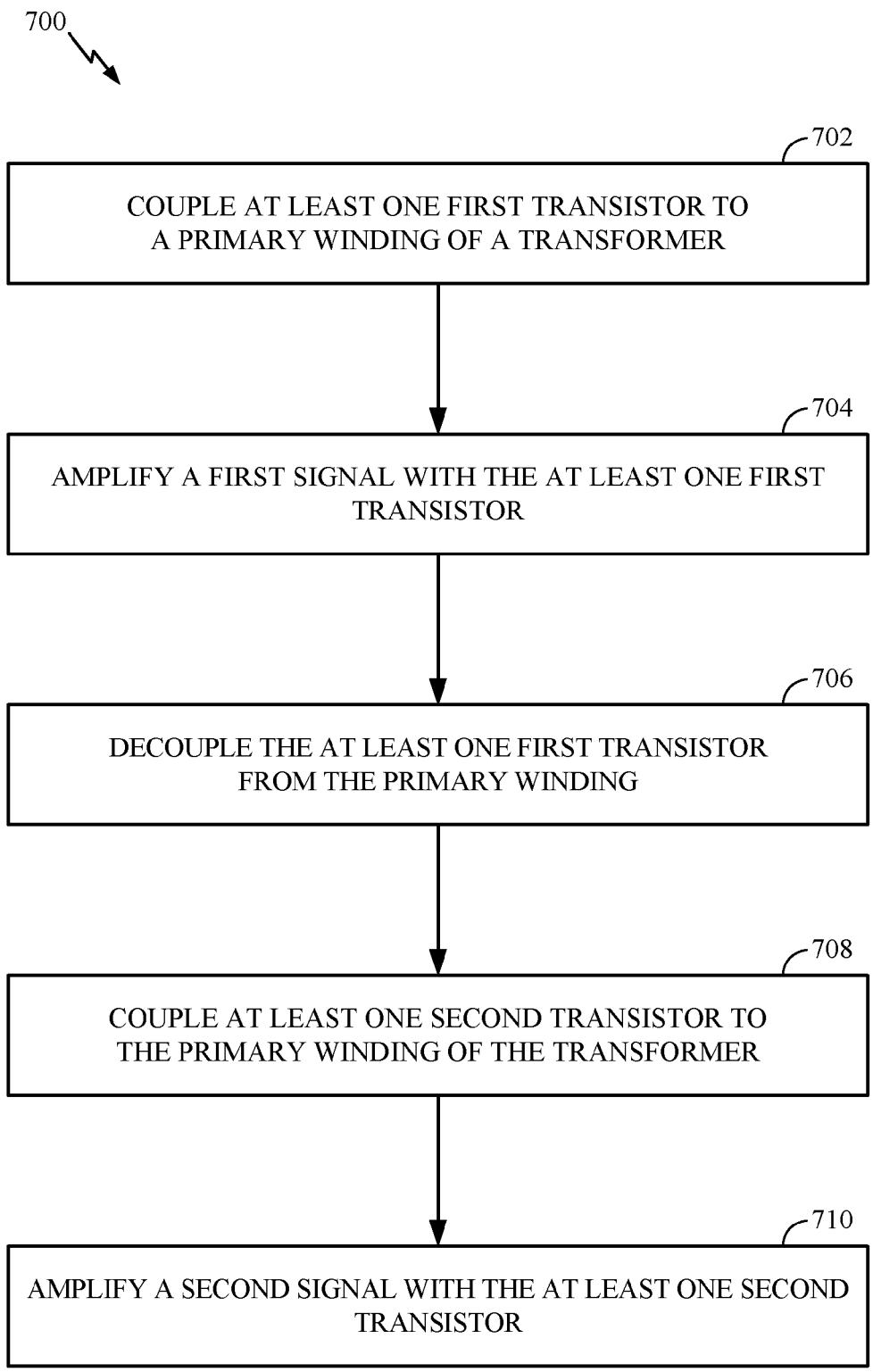
FIG. 7 is a flow diagram of example operations for amplifying a signal, in accordance with certain aspects of the present disclosure.

FIG. 7 is a flow diagram of example operations 700 for signal amplification, in accordance with certain aspects of the present disclosure. The operations 700 may be performed by a circuit, such as the circuits of FIG. 4B or FIG. 5A.

The operations 700 may begin, at block 702, by coupling at least one first transistor (e.g., transistor 402) to a primary winding of a transformer (e.g., transformer 502), and at block 704, by amplifying a first signal with the at least one first transistor. At block 706, the at least one first transistor may be decoupled from the primary winding. The operations 700 continue, at block 708, by coupling at least one second transistor (e.g., transistor 412) to the primary winding of the transformer, and at block 710, by amplifying a second signal with the at least one second transistor. In certain aspects, the first signal is received in a first mode of operation, and the second signal is received in a second mode of operation.

In certain aspects, the operations 700 also include inductively loading the at least one first transistor in the first mode of operation. In certain aspects, the operations 700 include presenting a transformer load to the at least one second transistor in the second mode of operation. In some cases, the second mode of operation (e.g., 5G band) has a higher operating frequency than the first mode of operation (e.g., 2G band).

In certain aspects, the primary winding of the transformer (e.g., transformer 502) may be selectively coupled to a first input terminal of a transconductance circuit (e.g., transconductance circuit 444), and a secondary winding of the transformer may be selectively coupled to a second input terminal of the transconductance circuit. In certain aspects, the primary winding and the secondary winding are coupled to the first input terminal and the second input terminal, respectively, prior to amplifying the first signal. In some cases, a secondary winding of the transformer (e.g., transformer 502) may be coupled to a first input terminal and a second input terminal of a transconductance circuit (e.g., transconductance circuit 444). In certain aspects, the secondary winding of the transformer is coupled to the first input terminal and the second input terminal prior to amplifying the second signal.

In certain aspects, a first terminal of the primary winding of the transformer (e.g., transformer 502) may be coupled to a voltage rail (e.g., $Vdd_P$). In this case, coupling the first transistor to the primary winding may include coupling the first transistor to a second terminal (e.g., terminal 518) of the primary winding prior to amplifying the first signal. Moreover, decoupling the first transistor may include decoupling the first transistor from the second terminal of the primary winding of the transformer after amplifying the first signal. In certain aspects, coupling the second transistor to the primary winding may include coupling the second transistor to the second terminal of the primary winding of the transformer prior to amplifying the second signal. In this case, a first terminal of the secondary winding may be coupled to a first input terminal of a transconductance circuit (e.g., transconductance circuit 444).

In some cases, the second terminal of the primary winding of the transformer (e.g., transformer 502) may be coupled to a second input terminal of the transconductance circuit and a second terminal (e.g., terminal 516) of the secondary winding may be coupled to another voltage rail (e.g., $Vdd_S$). In certain aspects, the second terminal of the primary winding of the transformer is coupled to the second input terminal of the transconductance circuit, prior to amplifying the first signal. In some cases, a first tap (e.g., tap 520) of the secondary winding may be coupled to the second input terminal of the transconductance circuit. In this case, a second tap (e.g., tap 522) of the secondary winding may be coupled to another voltage rail configured to provide a common-mode voltage for the transconductance circuit (e.g., transconductance circuit 444). In certain aspects, the first tap and the second tap are coupled to the second terminal and the other voltage rail, respectively, prior to amplifying the second signal.

In certain aspects, the operations 700 also include configuring the transformer (e.g., transformer 502) in the first mode of operation or the second mode of operation such that an effective turns ratio of the transformer in the first mode of operation is different from an effective turns ratio of the transformer in the second mode of operation. In some cases, the effective turns ratio of the transformer in the first mode of operation may be 1:1 (i.e., 3:3). For certain aspects, the effective turns ratio of the transformer in the second mode of operation may be 3:2.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for processing, means for determining, and means for operating may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2). Means for amplifying may comprise at least one transistor, such as the transistors 402 and 404 of FIG. 4B. Means for selectively coupling may comprise a switch, such as the switches 410 and 412 of FIG. 4B.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus comprising:
an amplifier comprising:
at least one first transistor configured to amplify a first signal;
at least one second transistor configured to amplify a second signal;
a transformer comprising a primary winding and a secondary winding;
one or more switches configured to selectively couple the primary winding to the first transistor or the second transistor;
a transconductance circuit coupled to the transformer; and
a mixer coupled to the transconductance circuit and configured to mix a signal generated by the transconductance circuit.

2. The apparatus of claim 1, wherein:
a first terminal of the primary winding of the transformer is coupled to a voltage rail;
the one or more switches are configured to selectively couple a second terminal of the primary winding of the transformer to the first transistor or the second transistor; and
a first terminal of the secondary winding is coupled to a first input terminal of the transconductance circuit.

3. The apparatus of claim 2, wherein the one or more switches are configured to couple the second terminal of the primary winding of the transformer to the first transistor in a first mode of operation and to the second transistor in a second mode of operation.

4. The apparatus of claim 1, wherein the one or more switches comprise:
a first switch configured to selectively couple the first transistor to the primary winding; and
a second switch configured to selectively couple the second transistor to the primary winding.

5. The apparatus of claim 4, wherein:
the first switch is closed and the second switch is open, in a first mode of operation of the apparatus; and
the first switch is open and the second switch is closed, in a second mode of operation of the apparatus.

6. The apparatus of claim 1, wherein:
the first transistor is further configured to receive the first signal in a first mode of operation of the apparatus;
the second transistor is further configured to receive the second signal in a second mode of operation of the apparatus; and
the one or more switches are configured to selectively couple the primary winding to the first transistor or the second transistor based on the first mode or the second mode of operation, respectively.

7. The apparatus of claim 6, wherein, in the first mode of operation:
the primary winding of the transformer is coupled to a first input terminal of the transconductance circuit and the first transistor; and
the secondary winding of the transformer is coupled to a second input terminal of the transconductance circuit.

8. The apparatus of claim 6, wherein, in the second mode of operation:
the primary winding of the transformer is coupled to the second transistor; and
the secondary winding of the transformer is coupled to a first input terminal and a second input terminal of the transconductance circuit.

9. The apparatus of claim 1, wherein:
the mixer is configured to mix the signal generated by the transconductance circuit with a first local oscillator signal in a first mode of operation of the apparatus;
the mixer is configured to mix the signal generated by the transconductance circuit with a second local oscillator signal in a second mode of operation of the apparatus; and
the second local oscillator signal has a different frequency than the first local oscillator signal.

10. An apparatus comprising:
an amplifier comprising:
at least one first transistor configured to amplify a first signal;
at least one second transistor configured to amplify a second signal;
a transformer comprising a primary winding and a secondary winding;
one or more switches configured to selectively couple the primary winding to the first transistor or the second transistor;
a transconductance circuit coupled to the transformer, wherein:
a first terminal of the primary winding of the transformer is coupled to a voltage rail;
the one or more switches are configured to selectively couple a second terminal of the primary winding of the transformer to the first transistor or the second transistor; and
a first terminal of the secondary winding is coupled to a first input terminal of the transconductance circuit;
a first switch configured to selectively couple the second terminal of the primary winding of the transformer to a second input terminal of the transconductance circuit; and
a second switch configured to selectively couple a second terminal of the secondary winding to another voltage rail.

11. The apparatus of claim 10, wherein the first switch and the second switch are closed in a first mode of operation of the apparatus.

12. The apparatus of claim 10, further comprising:
a third switch configured to selectively couple a first tap of the secondary winding to the second input terminal of the transconductance circuit; and
a fourth switch configured to selectively couple a second tap of the secondary winding to a voltage rail configured to provide a common-mode voltage for the transconductance circuit.

13. The apparatus of claim 12, wherein:
the first switch and the second switch are closed in a first mode of operation of the apparatus;
the first switch and the second switch are open in a second mode of operation; and
the third switch and the fourth switch are closed in the second mode of operation.

14. An apparatus comprising:
an amplifier comprising:
    at least one first transistor configured to amplify a first signal;
    at least one second transistor configured to amplify a second signal;
    a transformer comprising a primary winding and a secondary winding;
    one or more switches configured to selectively couple the primary winding to the first transistor or the second transistor;
a transconductance circuit coupled to the transformer, wherein:
    a first terminal of the primary winding of the transformer is coupled to a voltage rail;
    the one or more switches are configured to selectively couple a second terminal of the primary winding of the transformer to the first transistor or the second transistor; and
    a first terminal of the secondary winding is coupled to a first input terminal of the transconductance circuit;
a first switch configured to selectively couple a first tap of the secondary winding to a second input terminal of the transconductance circuit; and
a second switch configured to selectively couple a second tap of the secondary winding to a voltage rail configured to provide a common-mode voltage for the transconductance circuit.

15. The apparatus of claim 14, wherein:
the one or more switches are configured to couple the second terminal of the primary winding of the transformer to the first transistor in a first mode of operation of the apparatus and to the second transistor in a second mode of operation of the apparatus; and
the first switch and the second switch are closed in the second mode of operation.

16. A method for signal amplification, comprising:
coupling at least one first transistor to a primary winding of a transformer;
selectively coupling the primary winding of the transformer to a first input terminal of a transconductance circuit;
amplifying a first signal with the at least one first transistor;
decoupling the at least one first transistor from the primary winding;
coupling at least one second transistor to the primary winding of the transformer;
selectively coupling a secondary winding of the transformer to the first input terminal of the transconductance circuit; and
amplifying a second signal with the at least one second transistor.

17. The method of claim 16, wherein:
the first signal is received in a first mode of operation; and
the second signal is received in a second mode of operation.

18. The method of claim 16, wherein the primary winding is coupled to the first input terminal, prior to amplifying the first signal.

19. The method of claim 16, wherein the secondary winding of the transformer is coupled to the first input terminal and a second input terminal of the transconductance circuit prior to amplifying the second signal.

20. The method of claim 16, wherein:
a first terminal of the primary winding of the transformer is coupled to a voltage rail;
coupling the first transistor to the primary winding comprises coupling the first transistor to a second terminal of the primary winding prior to amplifying the first signal;
decoupling the first transistor comprises decoupling the first transistor from the second terminal of the primary winding of the transformer after amplifying the first signal; and
coupling the second transistor to the primary winding comprises coupling the second transistor to the second terminal of the primary winding of the transformer prior to amplifying the second signal, wherein a first terminal of the secondary winding of the transformer is coupled to a second input terminal of the transconductance circuit.

21. The method of claim 20, wherein:
selectively coupling the primary winding to the first input terminal of the transconductance circuit comprises coupling the second terminal of the primary winding of the transformer to the first input terminal of the transconductance circuit; and
the method further comprises coupling a second terminal of the secondary winding to another voltage rail.

22. The method of claim 21, wherein the second terminal of the primary winding of the transformer is coupled to the first input terminal of the transconductance circuit, prior to amplifying the first signal.

23. The method of claim 20, wherein:
selectively coupling the secondary winding to the first input terminal of the transconductance circuit comprises selectively coupling a first tap of the secondary winding to the first input terminal of the transconductance circuit; and
the method further comprises coupling a second tap of the secondary winding to another voltage rail configured to provide a common-mode voltage for the transconductance circuit.

24. The method of claim 23, wherein the first tap and the second tap are coupled to the first input terminal and the other voltage rail, respectively, prior to amplifying the second signal.

25. The method of claim 17, further comprising configuring the transformer in the first mode of operation or the second mode of operation such that an effective turns ratio of the transformer in the first mode of operation is different from an effective turns ratio of the transformer in the second mode of operation.

26. An apparatus for signal amplification, comprising:
means for amplifying a first signal;
means for amplifying a second signal;
means for selectively coupling the means for amplifying the first signal or the means for amplifying the second signal to a primary winding of a transformer;
means for selectively coupling the primary winding of the transformer to a first input terminal of a transconductance circuit; and
means for selectively coupling a secondary winding of the transformer to the first input terminal of the transconductance circuit.

* * * * *